US012627301B2

(12) United States Patent
Lim et al.

(10) Patent No.: US 12,627,301 B2
(45) Date of Patent: May 12, 2026

(54) CLOCK GENERATION DEVICE AND CLOCK GENERATION METHOD USING THE SAME

(71) Applicant: SAMSUNG ELECTRONICS CO., LTD., Suwon-si (KR)

(72) Inventors: Baekmin Lim, Suwon-si (KR); Gyusik Kim, Suwon-si (KR); Seungjin Kim, Suwon-si (KR); Seunghyun Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 108 days.

(21) Appl. No.: 18/624,590

(22) Filed: Apr. 2, 2024

(65) Prior Publication Data

US 2024/0340012 A1      Oct. 10, 2024

(30) Foreign Application Priority Data

Apr. 5, 2023    (KR) ......................... 10-2023-0044975
Sep. 20, 2023    (KR) ......................... 10-2023-0125653

(51) Int. Cl.
*H03L 7/081*        (2006.01)
*H03L 7/093*        (2006.01)

(52) U.S. Cl.
CPC .............. *H03L 7/081* (2013.01); *H03L 7/093* (2013.01)

(58) Field of Classification Search
CPC ......... H03L 7/081; H03L 7/093; H03L 7/085; H03L 7/08
See application file for complete search history.

(56) References Cited

U.S. PATENT DOCUMENTS 7,885,369 B2 *    2/2011    Beyer ..................... H03L 7/081
                                                            375/376
8,432,198 B2 *    4/2013    Liang ........................ H03L 7/23
                                                            327/147
9,614,537 B1    4/2017    Nandwana et al.
(Continued)

FOREIGN PATENT DOCUMENTS

KR        10-1724365        4/2017
KR        10-1890512        8/2018
KR        10-2480766        12/2022

OTHER PUBLICATIONS

Min-Seong Choo et al., "Review of Injection-Locked Oscillators" Journal of Semiconductor Engineering, vol. 1, Issue 1, Jun. 2020.

*Primary Examiner* — Diana J. Cheng
(74) *Attorney, Agent, or Firm* — Morgan, Lewis & Bockius LLP

(57)        ABSTRACT

A clock generation device includes a delay line that generates a modulated clock signal from a reference clock signal having a first period, a pulse generator configured to receive the modulated clock signal and generate a pulse signal in response to edges of pulses included in the modulated clock signal, and a clock generator that generates a clock signal having a second period distinguished from the first period, based on the reference clock signal and the pulse signal. The delay line generates a first pulse based on the reference clock signal and then generates a second pulse after a time modulated from the first period by a result of multiplying the second period by a first numerical value selected from a plurality of numerical values according to a certain probability.

20 Claims, 11 Drawing Sheets

100A

(56)          References Cited

U.S. PATENT DOCUMENTS

| | | | |
|---|---|---|---|
| 9,634,677 | B2 | 4/2017 | Huang |
| 10,110,239 | B1 * | 10/2018 | Shu ..................... H03K 5/1565 |
| 10,374,617 | B2 * | 8/2019 | Kuan ..................... H03L 7/083 |
| 10,404,262 | B2 | 9/2019 | Zerbe et al. |
| 11,251,798 | B2 | 2/2022 | Shi et al. |
| 11,342,923 | B1 | 5/2022 | Van Den Heuvel et al. |
| 2010/0259305 | A1 | 10/2010 | Lee et al. |
| 2022/0140831 | A1 | 5/2022 | Van Den Heuvel et al. |

* cited by examiner

【FIG. 1】
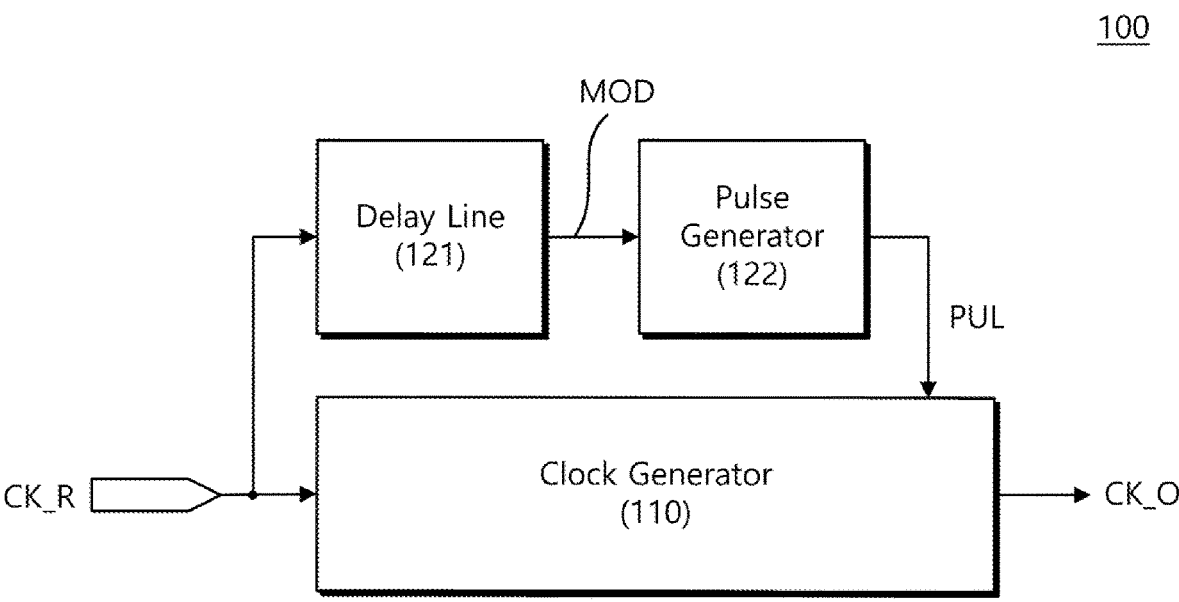

【FIG. 2A】
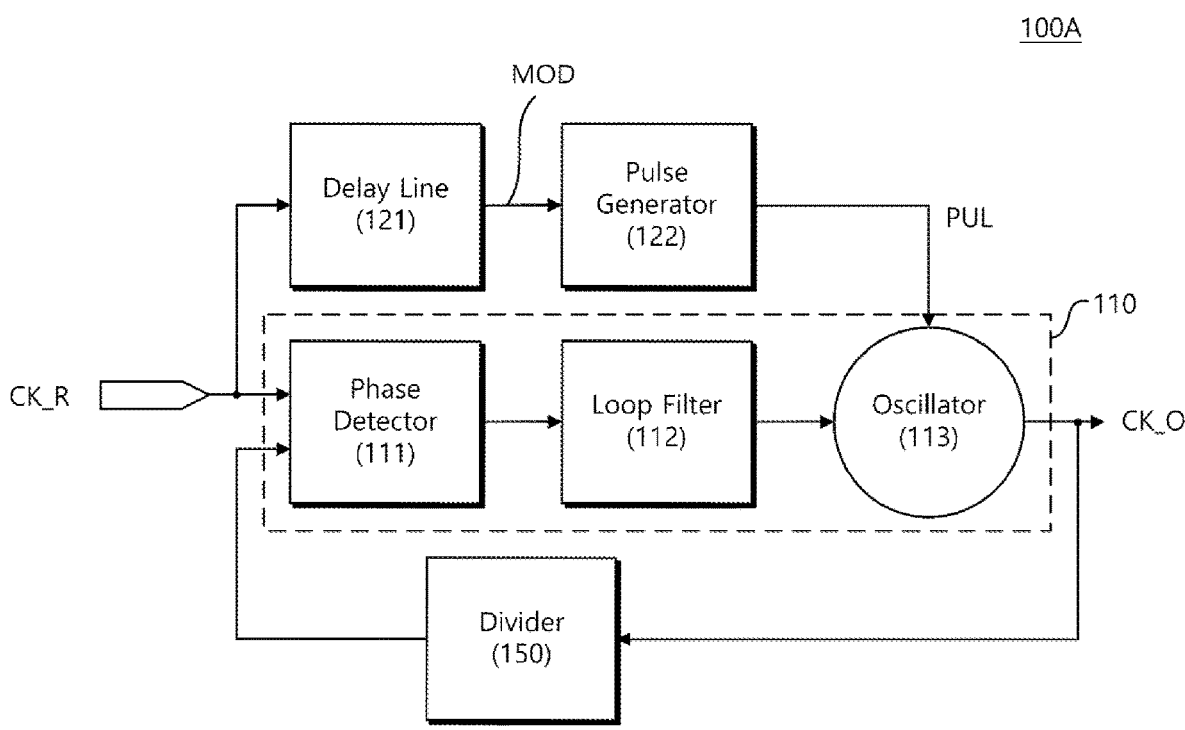

【FIG. 2B】
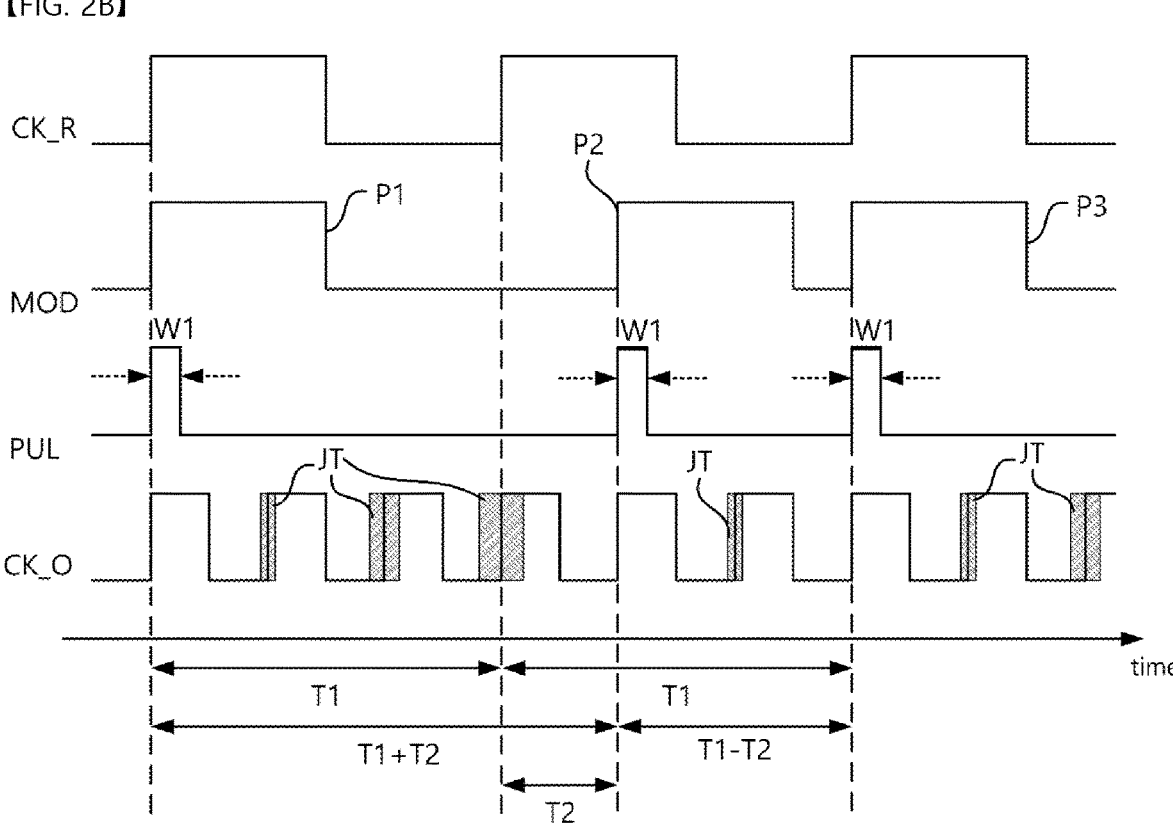

【FIG. 2C】
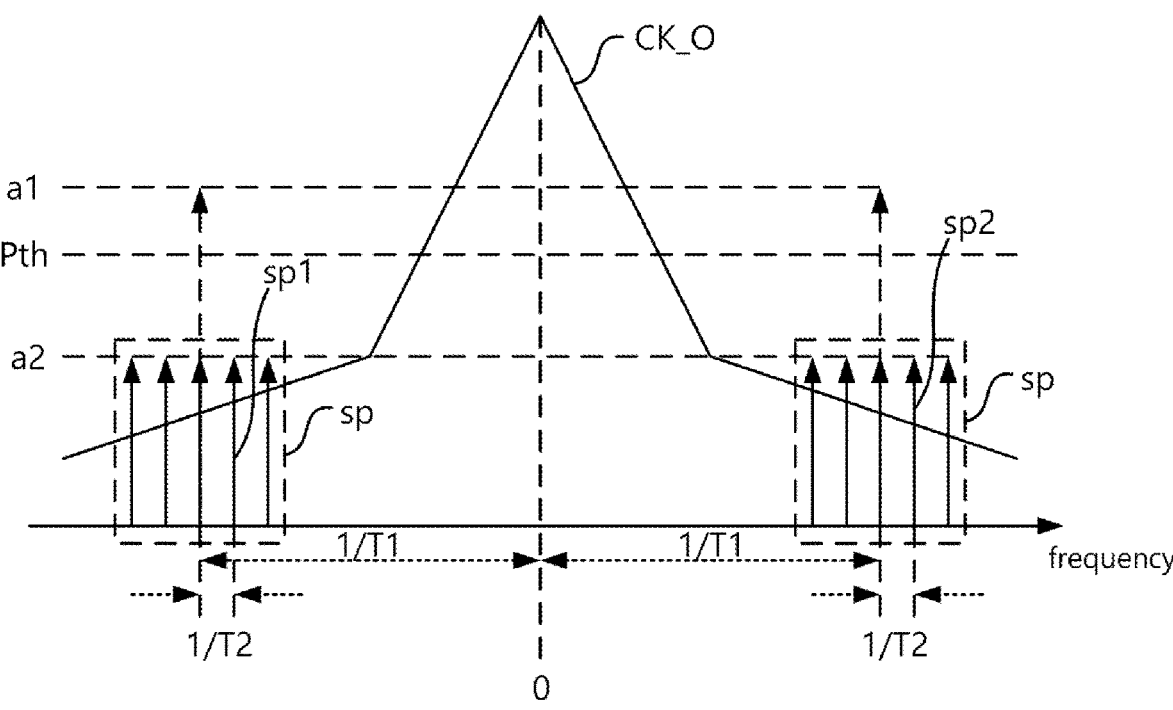

【FIG. 3】
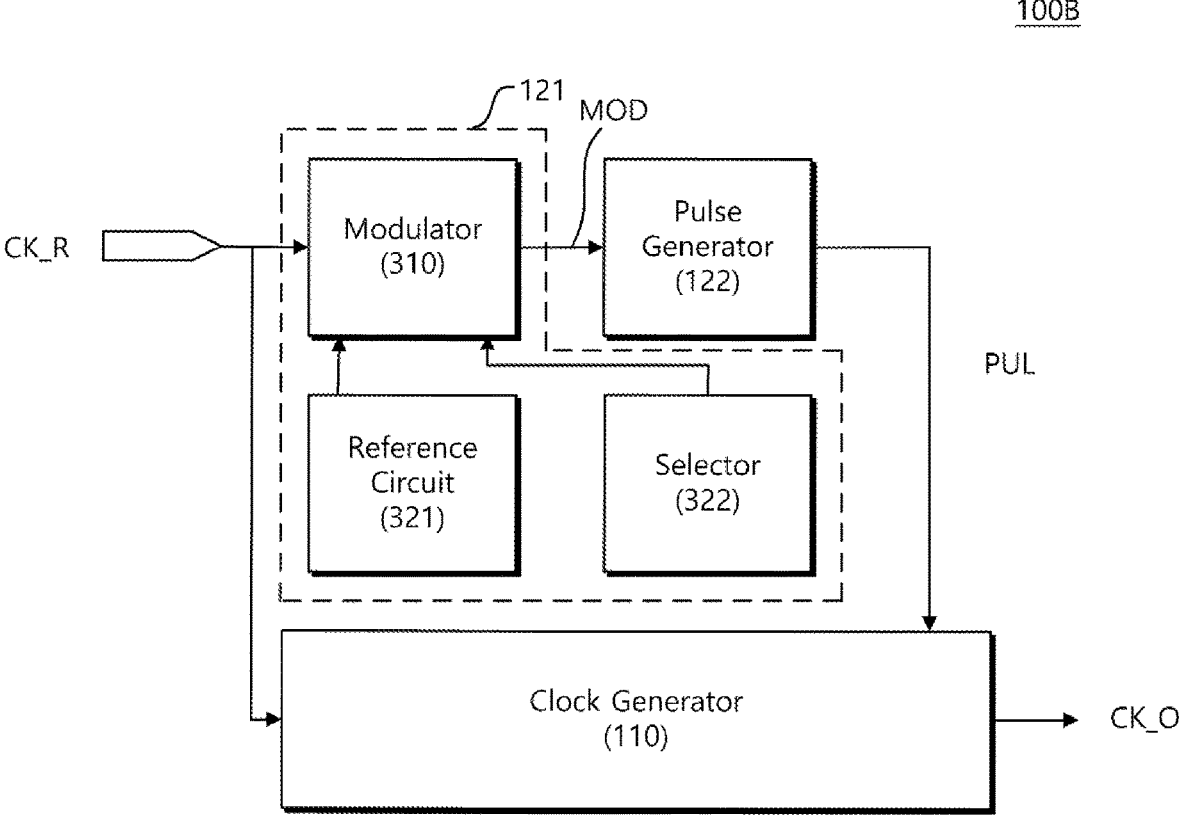

【FIG. 4A】
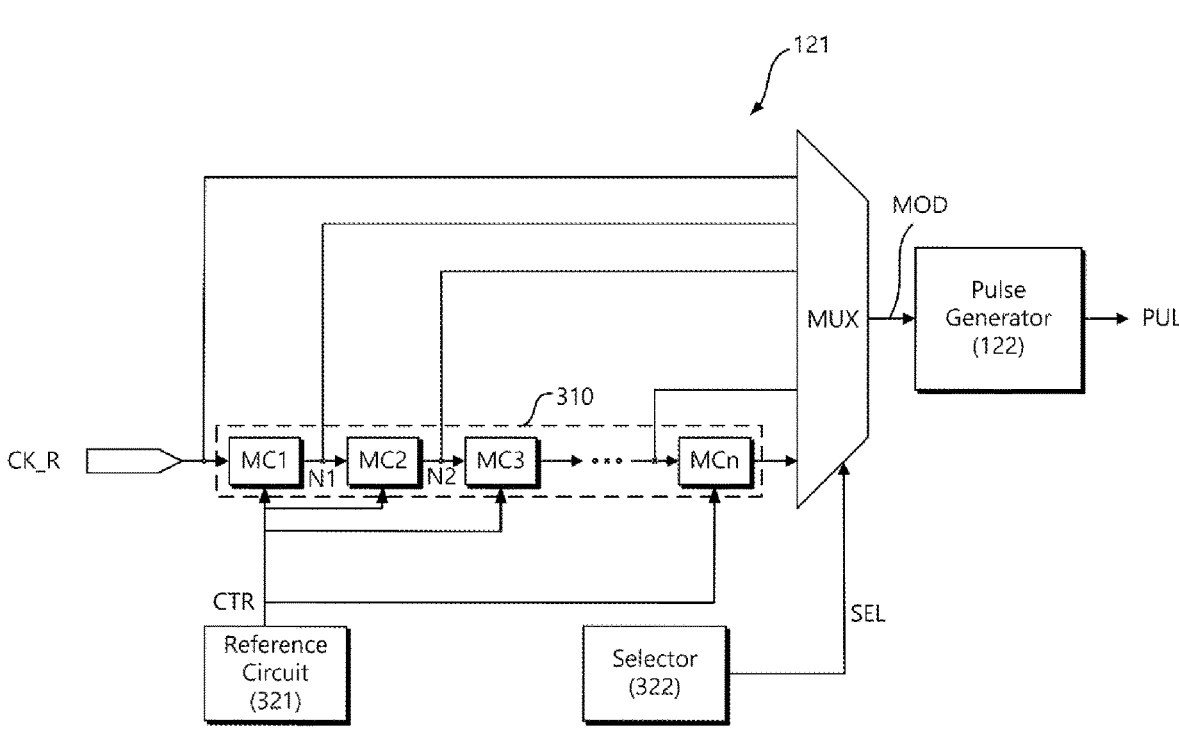

【FIG. 4B】
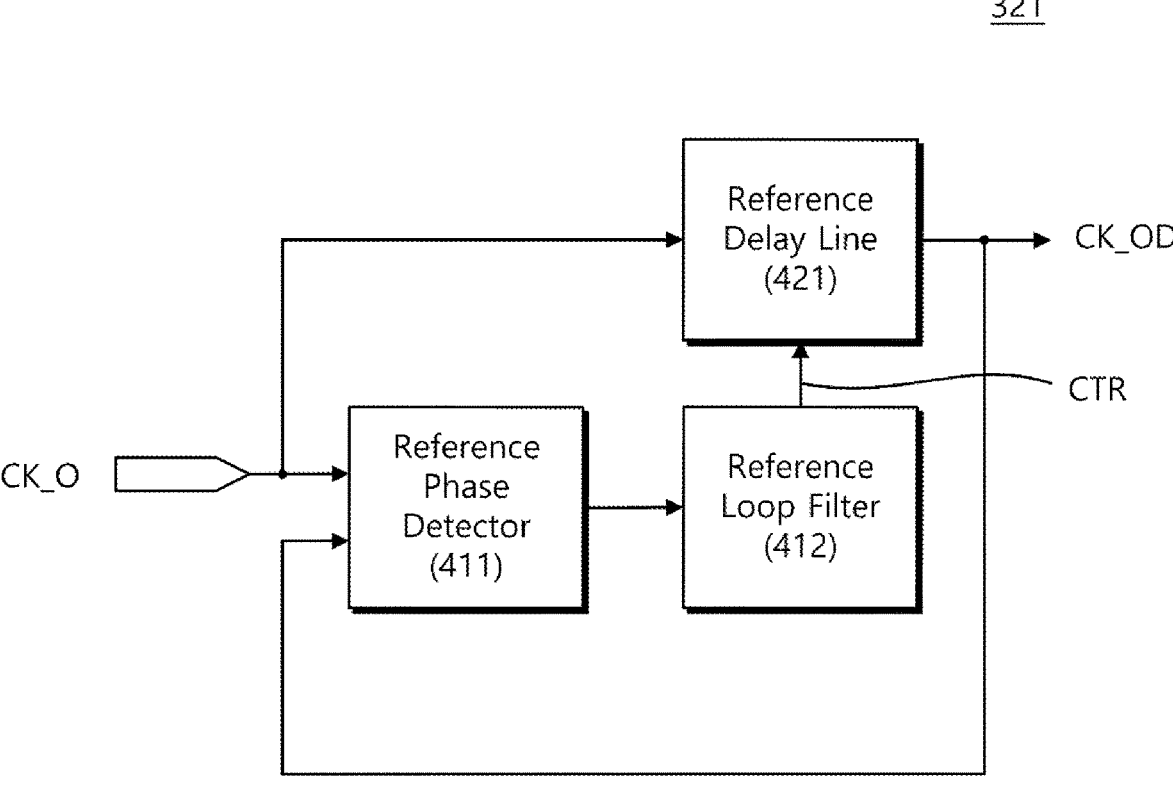

【FIG. 5】
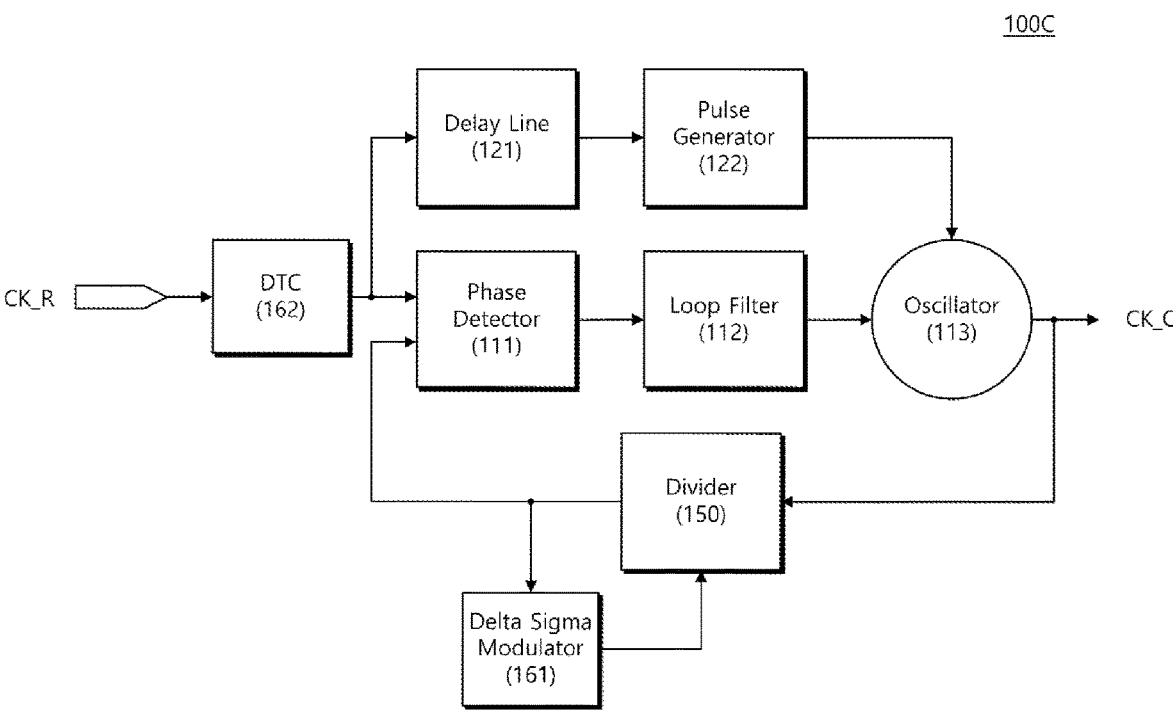

【FIG. 6】
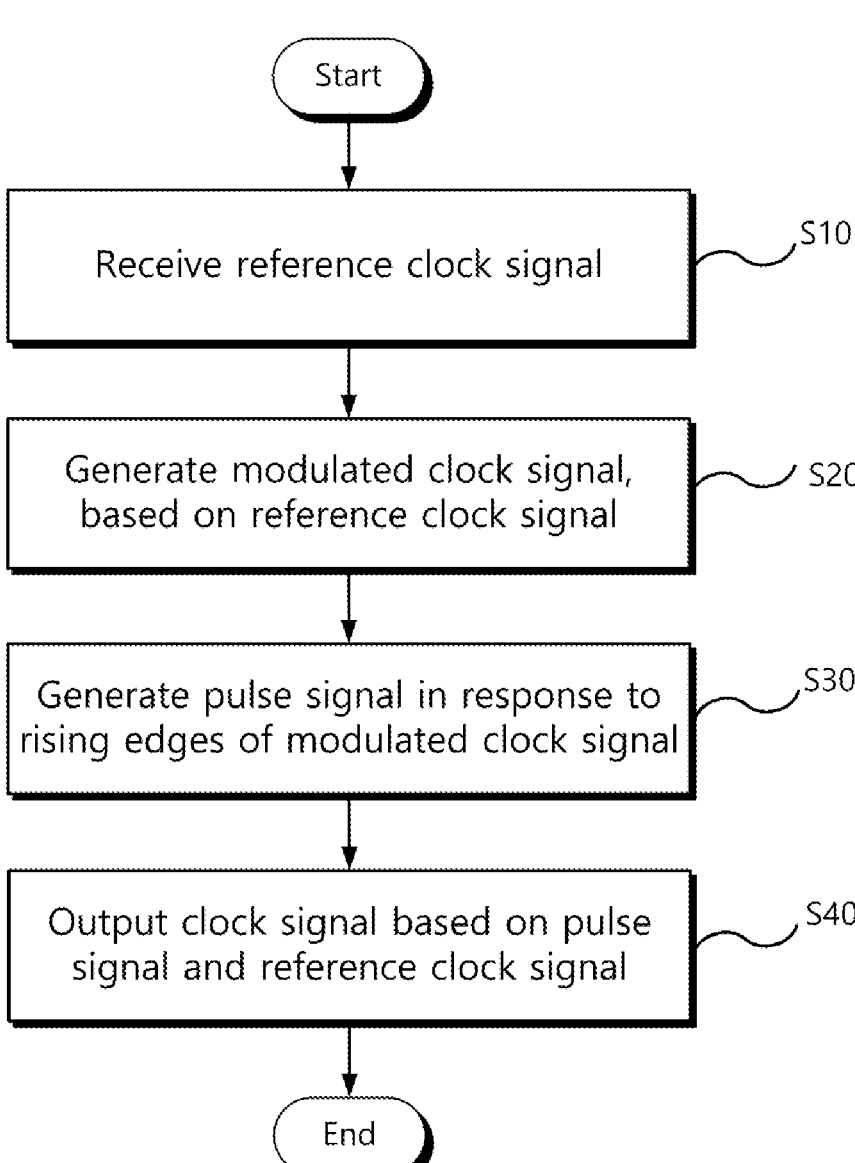

【FIG. 7】
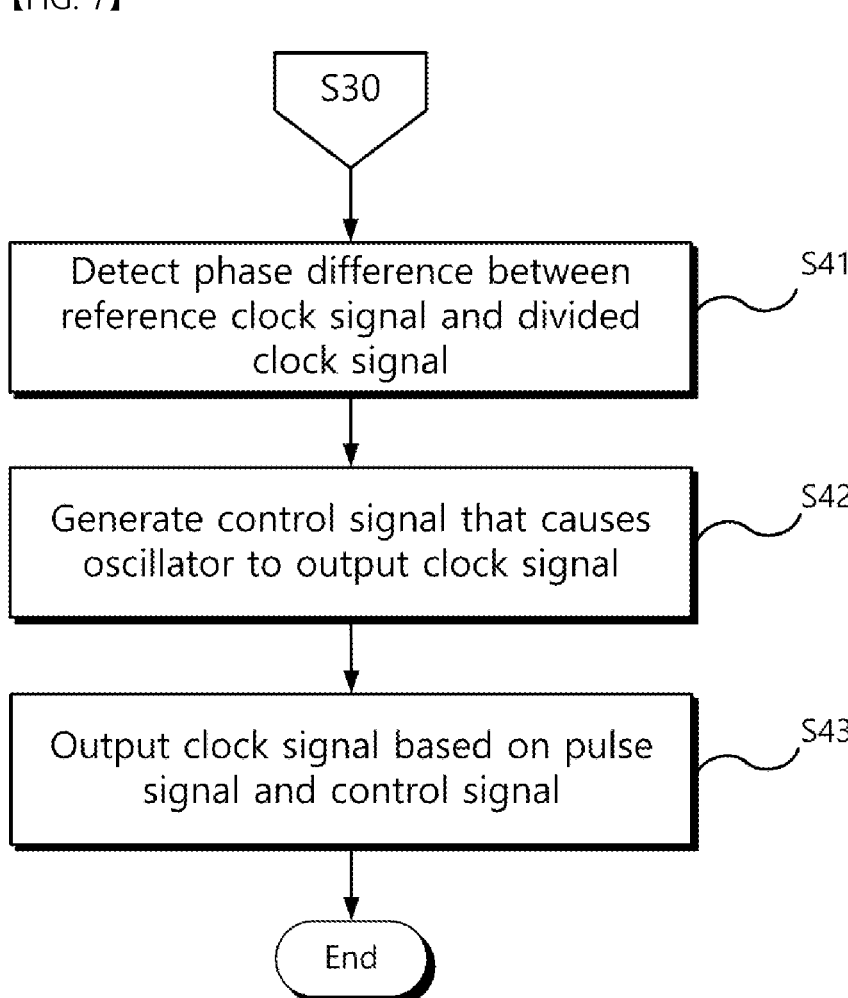

【FIG. 8】
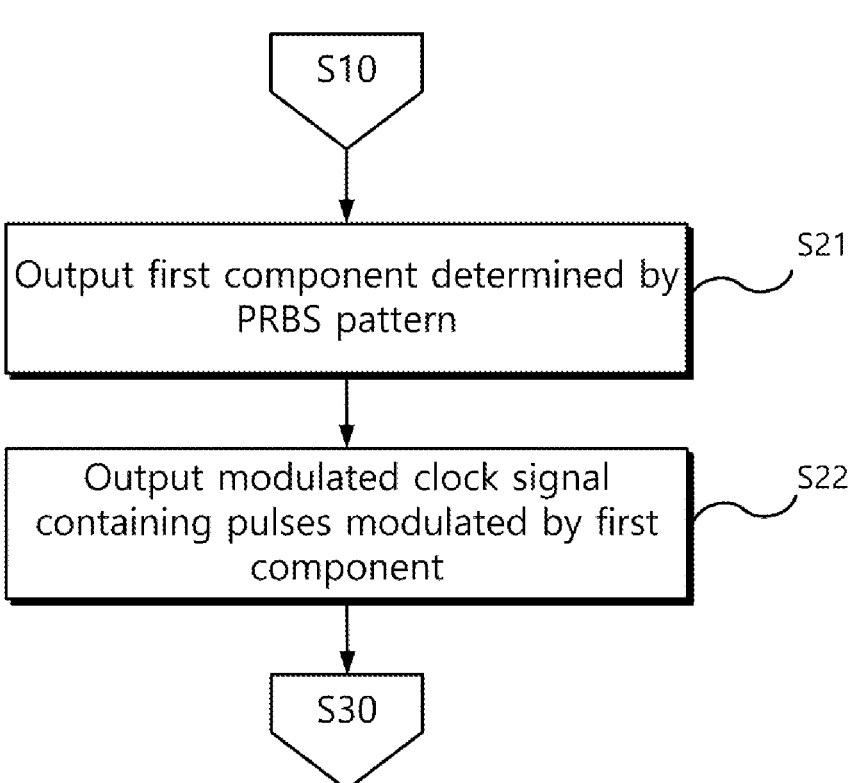

CLOCK GENERATION DEVICE AND CLOCK GENERATION METHOD USING THE SAME

CROSS-REFERENCE TO RELATED APPLICATIONS

This patent application claims priority under 35 U.S.C. § 119 to Korean Patent Application Nos. 10-2023-0044975 filed on Apr. 5, 2023, and 10-2023-0125653 filed on Sep. 20, 2023, in the Korean Intellectual Property Office, the disclosures of which are incorporated by reference in their entireties herein.

1. Technical Field

Embodiments of the present disclosure described herein are directed to a clock generation device and a clock generation method using the same.

2. Discussion of Related Art

An operation of an integrated circuit which processes digital signals may be synchronized with a clock signal. The integrated circuit may also use the clock signal to process an analog signal such as a signal in a radio frequency (RF) frequency band.

For example, data may be transmitted or received in synchronization with the clock signal like the data communication between a memory device and a memory controller. As the load of a bus transferring the data increases and a frequency of transferring the data becomes higher, the timing to synchronize the clock signal and the data becomes more important.

A phase-locked loop (PLL) or a delay-locked loop (DLL) may be used to synchronize the clock signal and the data. The phase-locked loop and the delay-locked loop are used in various application circuits to maintain the clock signal. However, these circuits may generate the clock signal with spurious components that make it difficult to synchronize the clock signal and the data.

SUMMARY

At least one embodiment of the present disclosure provides a clock generation device that increases the quality of a clock signal generated from a reference clock signal.

According to an embodiment, a clock generation device includes a delay line, a pulse generator and clock generator. The delay line generates a modulated clock signal from a reference clock signal having a first period. The pulse generator is configured to receive the modulated signal and generate a pulse signal in response to edges of pulses included in the modulated clock signal. The clock generator generates a clock signal having a second period distinguished from the first period, based on the reference clock signal and the pulse signal. The delay line generates a first pulse based on the reference clock signal and then generates a second pulse after a time modulated from the first period by a result of multiplying the second period by a first numerical value selected from a plurality of numerical values according to a certain probability.

According to an embodiment, a clock generation method includes: receiving a reference clock signal having a first period; generating a modulated clock signal based on the reference clock signal; generating a pulse signal in response to edges of a plurality of pulses included in the modulated clock signal; and generating a clock signal having a second period distinguished from the first period, based on the pulse signal and the reference clock signal. The generating of the modulated clock signal includes: generating a first pulse based on the reference clock signal; and generating a second pulse after a time obtained by modulating the first period by a result of multiplying the second period by a first numerical value, after generating the first pulse. The first numerical value may be selected from a plurality of numerical values according to a certain probability.

According to an embodiment, a clock generation device includes a delay line, a pulse generator, a phase detector, a loop filter, and an oscillator. The delay line generates a modulated clock signal from a reference clock signal having a first period. The pulse generator is connected to the delay line and generates a pulse signal in response to edges of a plurality pulses included in the modulated clock signal. The phase detector detects a phase difference between the reference clock signal and a divided clock signal. The loop filter generates a control signal, based on the phase difference from the phase detector. The oscillator outputs a clock signal having a second period based on the control signal and the pulse signal. The delay line generates a second pulse after a time obtained by modulating the first period by a result of multiplying the second period by a first numerical value, from a point in time when a first pulse is generated based on the reference clock signal. The first numerical value is selected from a plurality of numerical values according to a certain probability.

BRIEF DESCRIPTION OF THE FIGURES

The above and other objects and features of the present disclosure will become apparent by describing in detail embodiments thereof with reference to the accompanying drawings.

FIG. 1 is a block diagram illustrating a clock generation device according to an embodiment of the present disclosure.

FIG. 2A is a block diagram illustrating a clock generation device according to an embodiment.

FIG. 2B illustrates a pulse signal and a clock signal output depending on a reference clock signal input to a clock generation device of FIG. 2A.

FIG. 2C illustrates a probability density function of a clock signal and spurious components generated depending on a second pulse and a third pulse of FIG. 2B.

FIG. 3 is a block diagram illustrating a clock generation device according to an embodiment.

FIG. 4A is a block diagram illustrating a delay line including a plurality of modulation circuits.

FIG. 4B is a block diagram illustrating a reference circuit of FIG. 4A.

FIG. 5 is a block diagram illustrating a clock generation device according to another embodiment.

FIG. 6 is a flowchart illustrating an operation in which a clock generation device generates a clock signal, according to an embodiment.

FIG. 7 is a flowchart illustrating an operation in which a clock generation device generates a clock signal based on a phase difference between a reference clock signal and a divided clock signal, according to an embodiment.

FIG. 8 is a flowchart illustrating an operation in which a clock generation device generates a modulated clock signal by modulating a reference clock signal based on a first component determined by using a PRBS pattern, according to an embodiment.

DETAILED DESCRIPTION

Below, the present disclosure is described in detail and clearly to such an extent that one of ordinary skill in the art may implement embodiments of the present disclosure.

FIG. 1 is a block diagram illustrating a clock generation device according to an embodiment of the present disclosure.

Referring to FIG. 1, a clock generation device 100 according to an embodiment may include a delay line 121 (e.g., a delay circuit), a pulse generator 122 (e.g., a pulse generating circuit), and a clock generator 110 (e.g., a clock generating circuit).

In an embodiment, the clock generation device 100 generates a clock signal CK_O from a reference clock signal CK_R by using the delay line 121, the pulse generator 122, and the clock generator 110.

Herein, the reference clock signal CK_R may have a first period that is set in advance. Also, the clock signal CK_O may have a second period distinguished or different from the first period of the reference clock signal CK_R.

Accordingly, the clock generation device 100 may output the clock signal CK_O having the preset period (e.g., the second period) or frequency, based on the reference clock signal CK_R.

The clock generation device 100 may include the delay line 121 configured to generate a modulated clock signal MOD based on the reference clock signal CK_R.

According to an embodiment, the delay line 121 generates the modulated clock signal MOD by modulating the reference clock signal CK_R having the first period by as much as a multiple of the second period.

In an embodiment, the delay line 121 generates the modulated clock signal MOD by modulating at least one pulse included in the reference clock signal CK_R by as much as a multiple of the second period of the clock signal CK_O.

Herein, it may be understood that the multiple of the second period corresponds to a result obtained by multiplying the second period and a first component together. In an embodiment, the result is obtained by multiplying the second period by a numerical value randomly selected from among a plurality of available values according to a certain probability. For example, each of the available values may have an equal chance of being selected. For example, if there are four available values, each value would have a twenty five percent chance of being selected.

For example, the delay line 121 may generate a first pulse based on the reference clock signal CK_R and may then generate a second pulse after a time corresponding to a value obtained by adding a multiplication value of the second period and the first component to the first period.

In another example, the delay line 121 may generate a first pulse based on the reference clock signal CK_R and may then generate a second pulse after a time corresponding to a value obtained by subtracting a multiplication value of the second period and the first component from the first period.

Herein, it may be understood that the first component is an integer value. Accordingly, it may be understood that a multiple of the second period corresponds to a value obtained by multiplying the second period and the integer value together. However, the first component is not limited to the integer value.

The first component according to an embodiment may be determined from a plurality of components depending on a certain probability. In an embodiment, the first component is determined from the plurality of components depending on the certain probability, based on a pseudo random binary sequence (PRBS) pattern.

Herein, the PRBS pattern may be understood as a random pattern which is implemented such that each of the plurality of components is output with the same probability. For example, the PRBS pattern may be understood as a random pattern which is implemented to correspond to one of the plurality of components depending on the certain probability.

Accordingly, each of the plurality of components may be selected by the PRBS pattern with the same probability.

Herein, for example, the PRBS pattern may be a random bit string but need not be a completely random bit string when the PRBS pattern has a periodic feature. Also, the plurality of components may be understood as a plurality of integer values, but the present disclosure is not limited thereto.

Referring to the above components, the delay line 121 may generate the modulated clock signal MOD by delaying or advancing at least some pulses of the reference clock signal CK_R by as much as a value obtained by multiplying the second period and the first component together.

That is, the modulated clock signal MOD may include pulses which are generated by modulating at least some of the pulses of the reference clock signal CK_R by as much as a multiple of the second period.

The clock generation device 100 may include the pulse generator 122 configured to output a pulse signal PUL based on the modulated clock signal MOD.

According to an embodiment, the pulse generator 122 generates the pulse signal PUL in response to a rising edge of the modulated clock signal MOD.

In an embodiment, the pulse generator 122 generates the pulse signal PUL to include a plurality of pulses, and each of the pulses of the pulse signal PUL is generated in response to the rising edge of each of the plurality of pulses included in the modulated clock signal MOD.

For example, the pulse generator 122 may generate a pulse with a specified pulse width at a point in time when each pulse of the modulated clock signal MOD has the rising edge (or has a low to a high transition).

According to an embodiment, the pulse generator 122 outputs the pulses with the specified width in response to the rising edges of the plurality of pulses of the modulated clock signal MOD, where each pulse of the modulated clock signal MOD is generated at a point in time modulated by as much as a multiple of the second period.

For example, the pulse generator 122 may generate a pulse with a specified width in response to a second pulse generated after a time corresponding to a value obtained by adding the first period to a multiplication value of the second period and the first component from a point in time when a first pulse is generated in the modulated clock signal MOD.

In another example, after a first pulse of the modulated clock signal MOD is generated, the pulse generator 122 may generate a pulse of a specified width in response to a second pulse generated after a time corresponding to a value obtained by subtracting a multiplication value of the second period and the first component from the first period.

According to the above configuration, the pulse generator 122 may generate the pulse signal PUL corresponding to the modulated clock signal MOD, where at least some pulses of the pulse signal PUL are delayed or advanced by as much as a value obtained by multiplying the second period and the first component determined depending on the certain probability together.

In an embodiment, the pulse generator 122 generates the pulse signal PUL including pulses corresponding to a plurality of pulses of the modulated clock signal MOD, where each pulse of the pulse signal PUL is modulated by as much as a value obtained by multiplying the second period and the first component together.

the pulse signal PUL output from the pulse generator 122 may be input to the clock generator 110.

According to an embodiment, the clock generation device 100 includes the clock generator 110 which generates the clock signal CK_O based on the pulse signal PUL and the reference clock signal CK_R.

In an embodiment, the clock generator 110 outputs the clock signal CK_O including pulses synchronized with the reference clock signal CK_R at points in time when the pulses included in the pulse signal PUL are respectively input.

Since the clock signal CK_O is synchronized with the reference clock signal CK_R based on the pulse signal PUL, a jitter component accumulated on the clock signal CK_O while the clock signal CK_O is generated may be removed.

Accordingly, the clock generation device 100 according to an embodiment of the present disclosure may increase the quality of the clock signal CK_O generated from the reference clock signal CK_R.

Also, as the pulses included in the pulse signal PUL are input, the clock generator 110 may output spurious (hereinafter referred to as "spur") components together with the clock signal CK_O.

In detail, the clock generator 110 may output the spur component depending on the input timing of each pulse in response to input of the plurality of pulses included in the pulse signal PUL.

For example, when one pulse of the pulse signal PUL is delayed with respect to the first period by as much as two times the second period, the spur component may be generated by the one pulse at a frequency advanced with respect to the frequency corresponding to the first period by as much as two times the frequency corresponding to the second period.

In another example, when one pulse of the pulse signal PUL is advanced with respect to the first period by as much as the second period, the spur component may be generated by the one pulse at a frequency delayed with respect to the frequency corresponding to the first period by as much as the frequency corresponding to the second period.

That is, the spur components due to the pulse signal PUL may be generated at frequencies modulated by the pulses of the pulse signal PUL, where each of the pulses is generated at a point in time modulated by as much as a multiple of the second period, by as much as a multiple of the frequency corresponding to the second period.

In an embodiment, a multiple of the frequency corresponding to the second period is a value obtained by multiplying a reciprocal of the second period by the first component (or an integer value) determined depending on a PRBS pattern with a certain probability.

Accordingly, the spur components generated by the pulse signal PUL may be distributed and generated at frequencies obtained by modulating the frequency corresponding to the first period by as much as a multiple of the second period.

For example, the spur components which are generated together with the clock signal CK_O may be distributed into frequencies obtained by modulating the frequency corresponding to the first period by as much as one time (or once) to five times the frequency corresponding to the second period.

In this case, the spur components may have a relatively low peak value (or a maximum value) compared to the case where the spur components are generated by the pulse signal with the first period only at the frequency corresponding to the first period.

Herein, the peak value may be understood as indicating a probability density at which the spur components are generated.

The clock generation device 100 may distribute the spur components generated by the pulses of the pulse signal PUL into a plurality of frequencies obtained by modulating the frequency corresponding to the first period by as much as a multiple of the frequency corresponding to the second period.

The clock generation device 100 according to an embodiment of the present disclosure may prevent the quality of the clock signal CK_O from being degraded due to the spur components. That is, the clock generation device 100 may increase the quality of the clock signal CK_O generated from the reference clock signal CK_R.

FIG. 2A is a block diagram illustrating a clock generation device according to an embodiment. FIG. 2B illustrates a pulse signal and a clock signal output depending on a reference clock signal input to the clock generation device of FIG. 2A. FIG. 2C illustrates a probability density function of a clock signal and spurious components generated depending on a second pulse and a third pulse of FIG. 2C.

Referring to FIGS. 2A to 2C together, a clock generation device 100A according to an embodiment may generate the clock signal CK_O from the reference clock signal CK_R such that a spur component below a threshold value is caused by the pulse signal PUL.

Herein, the clock generation device 100A illustrated in FIG. 2A may be understood as an example of the clock generation device 100 of FIG. 1. Accordingly, components that are the same or substantially the same as the above components are marked with the same reference numerals/signs, and thus, additional description will be omitted to avoid redundancy.

Referring to FIG. 2A, the clock generator 110 of the clock generation device 100A includes a phase detector 111 (e.g., a phase detector circuit), a loop filter 112, and an oscillator 113.

The clock generation device 100A may further include a divider 150 for dividing the clock signal CK_O.

The divider 150 may receive the clock signal CK_O generated from the oscillator 113. Also, the divider 150 may divide the clock signal CK_O to generate a divided clock signal and provide the divided clock signal to the phase detector 111.

In an embodiment, the divider 150 divides the clock signal CK_O based on a ratio of a first frequency 1/T1 corresponding to a first period T1 of the reference clock signal CK_R and a second frequency 1/T2 corresponding to a second period T2 of the clock signal CK_O.

The clock generation device 100A may include the phase detector 111 for detecting a phase difference between the reference clock signal CK_R and the divided clock signal from the divider 150.

According to an embodiment, the phase detector 111 receives the reference clock signal CK_R from the outside and receives the divided clock signal from the divider 150.

The phase detector 111 may detect the phase difference between the reference clock signal CK_R and the divided clock signal.

The phase detector 111 may detect whether a loop including the phase detector 111, the loop filter 112, the oscillator 113, and the divider 150 is locked. When the clock signal CK_O has a target frequency (or a target period) uniformly, the loop may be referred to as being locked. For example, the loop may be considered locked when the clock signal CK_O has the target frequency repeatedly or has a frequency within a certain range of the target frequency repeatedly.

The loop filter 112 may generate a control signal based on the phase difference received from the phase detector 111. Herein, the control signal may have a magnitude which depends on the phase difference detected by the phase detector 111.

In an embodiment, based on the phase difference received from the phase detector 111, the loop filter 112 may generate the control signal such that the oscillator 113 outputs the clock signal CK_O having a preset phase difference with respect to the reference clock signal CK_R.

Herein, for example, the control signal may be understood as an analog voltage signal. Accordingly, the control signal may be referred to as an analog voltage signal, but the present disclosure is not limited thereto.

For example, the loop filter 112 may further include a charge pump for generating and transferring a voltage from the phase difference or a voltage buffer, but the present disclosure is not limited thereto.

The oscillator 113 may receive the control signal from the loop filter 112. Also, the oscillator 113 may receive the pulse signal PUL from the pulse generator 122.

The oscillator 113 may generate the clock signal CK_O based on the control signal from the loop filter 112.

In detail, the oscillator 113 may generate the clock signal CK_O with the second period T2 based on the control signal generated depending on the phase difference between the reference clock signal CK_R and the divided clock signal CK_O.

Referring to FIGS. 2A and 2B together, the clock signal CK_O which is generated to have the second period T2 through the oscillator 113 may include a jitter component JT that is accumulated on each pulse generated at the second period T2.

Since pulses are continuously generated through the oscillator 113, the clock signal CK_O may include the jitter component JT accumulated on each pulse.

The oscillator 113 may generate the clock signal CK_O including pulses synchronized with the reference clock signal CK_R at points in time when the pulses of the pulse signal PUL are respectively received.

In detail, the oscillator 113 may generate the clock signal CK_O synchronized with the reference clock signal CK_R whenever the pulse of the pulse signal PUL is received.

Since the clock signal CK_O is synchronized with the reference clock signal CK_R based on the pulse signal PUL, the jitter component JT accumulated on the clock signal CK_O while the clock signal CK_O is generated may be removed.

Accordingly, the clock generation device 100A according to an embodiment of the present disclosure may increase the quality of the clock signal CK_O generated from the reference clock signal CK_R.

Also, the delay line 121 may generate the modulated clock signal MOD by modulating the reference clock signal CK_R having the first period by as much as a multiple of the second period.

In an embodiment, the delay line 121 generates the modulated clock signal MOD by modulating at least one pulse included in the reference clock signal CK_R by as much as a multiple of the second period of the clock signal CK_O.

For example, the delay line 121 may generate a first pulse P1 based on the reference clock signal CK_R and may generate a second pulse P2 after a time corresponding to a value obtained by adding the first period T1 and the second period T2.

Also, for example, the delay line 121 may generate the second pulse P2 and may generate a third pulse P3 after a time corresponding to a value obtained by subtracting the second period T2 from the first period T1.

However, a multiple of the second period which is used for the delay line 121 to modulate the reference clock signal CK_R is not limited to the above example.

In another example, the delay line 121 may generate the first pulse P1 based on the reference clock signal CK_R and may generate the second pulse P2 after a time obtained by modulating a time corresponding to three times the second period T2 from the first period T1.

According to an embodiment, the delay line 121 may generate the second pulse P2 and may generate the third pulse P3 after a time modulated by as much as a value obtaining by multiplying the second period T2 and a second component distinguished from the first component together.

Also, the delay line 121 may generate the second pulse P2 and may generate the third pulse P3 after a time corresponding to a value obtained by subtracting two times the second period T2 from the first period T1.

That is, based on the reference clock signal CK_R, the delay line 121 may generate the modulated clock signal MOD, at least some pulses of which are delayed or advanced by as much as a value obtained by multiplying the second period T2 and the first component together.

Herein, for example, the first component may be understood as an integer value determined depending on a certain probability based on a PRBS pattern. However, the first component is not limited to the integer value.

Also, herein, the PRBS pattern may be understood as a random pattern which is implemented such that each of the plurality of components is output with the same probability. For example, the PRBS pattern may be understood as a random pattern which is implemented to correspond to one of the plurality of components depending on the certain probability.

The pulse generator 122 according to an embodiment outputs pulses with a specified width W1 in response to the rising edges of the plurality of pulses P1, P2, and P3 of the modulated clock signal MOD, each of which is generated at a point in time modulated by as much as a multiple of the second period.

For example, after the first pulse P1 of the modulated clock signal MOD is generated, the pulse generator 122 may generate the pulse with the specified width W1 in response to the rising edge of the second pulse P2 generated after a time of (T1+T2) corresponding to a value obtained by adding a multiplication value of "1" times the second period T2 to the first period T1.

Also, after the second pulse P2 of the modulated clock signal MOD is generated, the pulse generator 122 may generate the pulse with the specified width W1 in response to the rising edge of the third pulse P3 generated after a time of (T1−T2) corresponding to a value obtained by subtracting a multiplication value of "1" times the second period T2 from the first period T1.

In addition, referring to FIGS. 2A to 2C together, as the pulses included in the pulse signal PUL are received, the oscillator 113 may output spur components sp together with the clock signal CK_O.

In detail, the oscillator 113 may output a spur component depending on the input timing of each pulse in response to input of the plurality of pulses included in the pulse signal PUL.

For example, when the generation of one pulse of the pulse signal PUL is delayed with respect to the first period T1 by as much as one time the second period T2, a first spur component sp1 due to the one pulse may be caused at a frequency "1/T1−1/T2" corresponding to a value obtained by subtracting the second frequency 1/T2 corresponding to the second period T2 from the first frequency 1/T1 corresponding to the first period T1.

In another example, when the generation of one pulse of the pulse signal PUL is advanced with respect to the first period T1 by as much as one time the second period T2, a second spur component sp2 due to the one pulse may be caused at a frequency "1/T1+1/T2" corresponding to a value obtained by adding the second frequency 1/T2 corresponding to the second period T2 and the first frequency 1/T1 corresponding to the first period T1.

That is, the spur components due to the pulse signal PUL may be generated at frequencies modulated by the pulses of the pulse signal PUL, where each of the pulses is generated at a point in time modulated by as much as a multiple of the second period T2, by as much as a multiple of the second frequency 1/T2 corresponding to the second period T2.

Herein, the multiple of the second frequency 1/T2 corresponding to the second period T2 may be understood as a value obtained by multiplying the reciprocal of the second period T2 by the first component (e.g., "1" or "2") determined depending on the PRBS pattern with the certain probability.

Accordingly, the spur component sp due to the pulse signal PUL may be distributed and generated at frequencies, where each of the frequencies is obtained by modulating the first frequency 1/T1 corresponding to the first period T1 by as much as a multiple of the second frequency 1/T2 corresponding to the second period T2.

For example, the spur components sp which are generated together with the clock signal CK_O may be distributed into frequencies respectively obtained by modulating the first frequency 1/T1 corresponding to the first period T1 by as much as one time to five times the second frequency 1/T2 corresponding to the second period T2.

In this case, the spur components sp may have a relatively low peak value (or maximum value) compared to the case where the spur components sp are generated by pulse signals according to the first period T1 only at the first frequency 1/T1 corresponding to the first period T1.

Herein, the peak value may be referred to as a probability density with which a spur component or a clock signal is generated for each frequency.

For example, when the pulse generator 122 generates pulses depending on the first period T1, the oscillator 113 may output a spur component with a first peak value a1 at the first frequency 1/T1.

In this case, the probability density of spur components output at the first frequency 1/T1 may have the first peak value a1 of a preset threshold value Pth or more.

In contrast, when the pulse generator 122 generates pulses modulated by as much as a multiple of the second period T2, the oscillator 113 may output the spur components sp with a second peak value a2 at frequencies modulated by as much as a multiple of the second frequency 1/T2 corresponding to the second period T2.

In this case, the probability density of the spur components sp output at the frequencies modulated by as much as the multiple of the second frequency 1/T2 may have the second peak value a2 below the preset threshold value Pth.

Herein the threshold value Pth may be understood as a probability density of a spur component which is required for the clock signal CK_O to be output through the clock generation device 100A to have a target quality.

Referring to the above components, the clock generation device 100A may generate the spur components sp due to the pulses of the pulse signal PUL so as to be distributed into a plurality of frequencies each obtained by modulating the first frequency 1/T1 by as much as a multiple of the second frequency 1/T2, and thus, the spur components sp below the threshold value Pth may be generated.

Accordingly, the clock generation device 100A according to an embodiment of the present disclosure may prevent the quality of the clock signal CK_O from being degraded due to the spur components. That is, the clock generation device 100A may increase the quality of the clock signal CK_O generated from the reference clock signal CK_R.

FIG. 3 is a block diagram illustrating a clock generation device according to an embodiment. FIG. 4A is a block diagram illustrating a delay line including a plurality of modulation circuits. FIG. 4B is a block diagram illustrating a reference circuit of FIG. 4A.

Referring to FIGS. 3 to 4B together, a clock generation device 100B according to an embodiment may generate the modulated clock signal MOD modulated by as much as a multiple of the second period T2 by using at least some of a plurality of modulation circuits MC1 and MC2 to MCn.

Herein, the clock generation device 100B illustrated in FIG. 3 may be understood as an example of the clock generation device 100 of FIG. 1. Accordingly, components that are the same or substantially the same as the above components are marked with the same reference numerals/signs, and thus, additional description will be omitted to avoid redundancy.

According to an embodiment, the delay line 121 includes a modulator 310 (e.g., a modulator circuit), a reference circuit 321, and a selector 322 (e.g., a selector circuit).

The delay line 121 may generate the modulated clock signal MOD, which is obtained by modulating at least some pulses of the reference clock signal CK_R input thereto by as much as a multiple of the second period T2, by using the modulator 310, the reference circuit 321, and the selector 322.

Herein, referring to FIG. 4A, the modulator 310 may include the plurality of modulation circuits MC1 and MC2 to MCn connected in series. For example, the modulator 310 may include five modulation circuits MC1, MC2, MC3, MC4, and MC5 connected in series.

Referring to FIG. 4B, the reference circuit 321 according to an embodiment includes a reference delay line 421 (e.g., a delay line circuit), a reference phase detector 411 (e.g., a detector circuit), and a reference loop filter 412.

According to an embodiment, the reference circuit 321 delays the clock signal CK_O input thereto by as much as the second period T2 by using the reference delay line 421, the reference phase detector 411, and the reference loop filter 412.

As such, the reference circuit 321 may output a delay clock signal CK_OD obtained by delaying the clock signal CK_O by as much as the second period T2.

The reference circuit 321 may include the reference phase detector 411 for detecting a phase difference between the clock signal CK_O and the delay clock signal CK_OD.

The reference phase detector 411 may receive the clock signal CK_O from the outside of the reference circuit 321. Also, the reference phase detector 411 may receive the delay clock signal CK_OD delayed by the reference delay line 421 by as much as the second period T2.

The reference phase detector 411 may detect the phase difference between the clock signal CK_O and the delay clock signal CK_OD.

The reference loop filter 412 may generate a modulation signal CTR based on the phase difference received from the reference phase detector 411. The modulation signal CTR according to an embodiment has a magnitude which depends on the phase difference detected by the reference phase detector 411.

According to an embodiment, the reference delay line 421 delays the clock signal CK_O input thereto by as much as the second period T2 based on the modulation signal CTR received from the reference loop filter 412.

According to an embodiment, the reference delay line 421 advances the clock signal CK_O input thereto by as much as the second period T2 based on the modulation signal CTR received from the reference loop filter 412.

That is, the reference delay line 421 may modulate the clock signal CK_O input thereto by as much as the second period T2 based on the modulation signal CTR received from the reference loop filter 412.

The reference delay line 421 may delay the clock signal CK_O input thereto by as much as the second period T2 so as to be output as the delay clock signal CK_OD.

Also, the reference circuit 321 may output the modulation signal CTR which allows each of the modulation circuits MC1 and MC2 to MCn to modulate an input signal by as much as the second period T2.

Accordingly, each of the modulation circuits MC1 and MC2 to MCn may modulate an input signal by as much as the second period T2, based on the modulation signal CTR received from the reference circuit 321.

Referring to FIGS. 4A and 4B together, each of the modulation circuits MC1 and MC2 to MCn may modulate an input signal by as much as the second period T2, based on the modulation signal CTR received from the reference circuit 321.

For example, the first modulation circuit MC1 may delay the reference clock signal CK_R input thereto by as much as the second period T2 so as to be output to a first node N1.

According to an embodiment, each of the modulation circuits MC1 and MC2 to MCn advances an input signal by as much as the second period T2, based on the modulation signal CTR from the reference circuit 321.

Herein, for example, each of the modulation circuits MC1 and MC2 to MCn may be understood as a circuit including substantially the same components as the reference circuit 321.

According to an embodiment, each of the modulation circuits MC1 and MC2 to MCn modulates an input signal by as much as the second period T2, based on the modulation signal CTR received from the reference circuit 321.

In this case, for example, each of the modulation circuits MC1 and MC2 to MCn may be understood as a circuit having a configuration in which two components substantially identical to those of the reference circuit 321 are connected in series.

The delay line 121 may include the selector 322 which outputs a selection signal SEL for controlling a switching circuit MUX (e.g., a multiplexer) connected to the plurality of modulation circuits MC1 and MC2 to MCn.

The selector 322 may be configured to determine the first component. In an embodiment, the selector 322 outputs the selection signal SEL including the first component determined depending on the certain probability based on the PRBS pattern.

The selector 322 may output the selection signal SEL which allows the switching circuit MUX connected to the modulator 310 to selectively output some of signals output from nodes between the plurality of modulation circuits MC1 and MC2 to MCn depending on the certain probability. For example, the switching circuit MUX may selectively output one of the signal output from nodes between the plurality of modulation circuits MC1 and MC2 to MCn based on a value of the selection signal SEL.

Herein, the PRBS pattern may be understood as a random pattern which is implemented such that an electrical path connected to each of the nodes between the plurality of modulation circuits MC1 and MC2 to MCn is selected by the switching circuit MUX depending on the certain probability.

Accordingly, the selector 322 according to an embodiment of the present disclosure may be referred to as a uniformly distributed-pseudo random binary sequence (U-PRBS) circuit or a linear feedback shift register (LFSR) circuit generating the PRBS pattern.

For example, the selector 322 may output the selection signal SEL which controls the switching circuit MUX such that a signal output from the first node N1 between the first modulation circuit MC1 and the second modulation circuit MC2 is selected.

Herein, the signal output from the first node N1 may be a signal obtained by delaying the reference clock signal CK_R by as much as the second period T2. Herein, the first component may be understood as "1".

In another example, the selector 322 may output the selection signal SEL which controls the switching circuit MUX such that a signal output from the second node N2 between the second modulation circuit MC2 and the third modulation circuit MC3 is selected.

Herein, the signal output from the second node N2 may be a signal obtained by delaying the reference clock signal CK_R by as much as two times the second period T2. Herein, the first component may be understood as "2".

In the delay line 121, the switching circuit MUX may output the modulated clock signal MOD in response to the selection signal SEL of the selector 322.

In an embodiment, based on the first component determined depending on the certain probability, the delay line 121 outputs the modulated clock signal MOD modulated by as much as a multiplication value of the first component times the second period T2 from the first period T1 of the reference clock signal CK_R.

In addition, the pulse generator 122 may output the pulse signal PUL in response to input of the modulated clock signal MOD. In detail, the pulse generator 122 may generate a plurality of pulses, where each of the pulses has a specified width and is generated in response to the rising edge of each of a plurality of pulses included in the modulated clock signal MOD.

Herein, the pulses included in the pulse signal PUL may be generated to be distributed into points in time modulated by as much as a multiple of the second period T2 from the first period T1.

Also, the spur component sp due to the pulses included in the pulse signal PUL may be distributed and generated at frequencies, where each of the frequencies is modulated by as much as a multiple of the second frequency 1/T2 corresponding to the second period T2 from the first frequency 1/T1 corresponding to the first period T1.

In this case, the spur components sp may have a relatively low peak value (or maximum value) compared to the case where the spur components sp are generated by pulse signals with the first period T1 only at the first frequency 1/T1 corresponding to the first period T1.

Accordingly, the clock generation device 100B according to an embodiment of the present disclosure may prevent the quality of the clock signal CK_O from being degraded due to the spur components. That is, the clock generation device 100B may increase the quality of the clock signal CK_O generated from the reference clock signal CK_R.

FIG. 5 is a block diagram illustrating a clock generation device according to an embodiment.

Referring to FIG. 5, a clock generation device 100C according to an embodiment may include the delay line 121, the pulse generator 122, the phase detector 111, the loop filter 112, the oscillator 113, the divider 150 (e.g., a divider circuit), a delta sigma modulator 161 (e.g., a modulator circuit), and a digital-to-time convertor (DTC) 162.

Herein, the clock generation device 100C illustrated in FIG. 5 may be understood as an example of the clock generation device 100 of FIG. 1. Accordingly, components that are the same or substantially the same as the above components are marked with the same reference numerals/signs, and thus, additional description will be omitted to avoid redundancy.

According to an embodiment, the clock generation device 100C includes the delta sigma modulator 161 for dividing the clock signal CK_O by a fractional value. In detail, the delta sigma modulator 161 may output dividing ratio information for dividing the clock signal CK_O.

Herein, for example, the dividing ratio information may be understood as a frequency ratio of the reference clock signal CK_R input to the clock generation device 100C and the clock signal CK_O. Also, the dividing ratio information may be understood as information which is used to determine how much to divide the frequency of the clock signal CK_O.

The delta sigma modulator 161 may output one dividing ratio among a plurality of integer dividing ratios such that the clock generation device 100C performs a fractional division-based phase locked operation.

The divider 150 may divide the clock signal CK_O by a fractional value, based on the dividing ratio information received from the delta sigma modulator 161.

Also, the clock generation device 100C may include the DTC 162 which converts the reference clock signal CK_R based on the dividing ratio information received from the delta sigma modulator 161.

The clock generation device 100C may generate the clock signal CK_O based on a phase difference between the reference clock signal CK_R converted by using the DTC 162 and the divided clock signal CK_O.

As such, the clock generation device 100C according to the present disclosure may minimize a noise which is caused in the process of dividing the clock signal CK_O with a fractional value by using the delta sigma modulator 161.

Meanwhile, the delay line 121 may output the modulated clock signal MOD modulated by as much as a multiplication value of first component times the second period T2 from the first period T1 of the reference clock signal CK_R.

Herein, the first component may be understood as an integer value determined depending on the certain probability based on the PRBS pattern.

Accordingly, the modulated clock signal MOD may include at least one pulse modulated by as much as a multiple of the second period T2 from the first period T1 of the reference clock signal CK_R.

Also, the pulse generator 122 may output the pulse signal PUL in response to input of the modulated clock signal MOD. In detail, the pulse generator 122 may generate a plurality of pulses, where each of the pules has a specified width and is generated in response to the rising edge of each of a plurality of pulses included in the modulated clock signal MOD.

Herein, the pulses included in the pulse signal PUL may be generated to be distributed into points in time modulated by as much as a multiple of the second period T2 from the first period T1.

Also, the spur component sp due to the pulses included in the pulse signal PUL may be distributed and generated at frequencies, where each of the frequencies is modulated by as much as a multiple of the second frequency 1/T2 corresponding to the second period T2 from the first frequency 1/T1 corresponding to the first period T1.

In this case, the spur components sp may have a relatively low peak value (or maximum value) compared to the case where the spur components sp are generated by pulse signals with the first period T1 only at the first frequency 1/T1 corresponding to the first period T1.

As such, the clock generation device 100C according to an embodiment of the present disclosure may prevent the quality of the clock signal CK_O from being degraded due to the spur components in the process of outputting the clock signal CK_O based on the clock signal CK_O divided by a fractional value.

That is, the clock generation device 100C may increase the quality of the clock signal CK_O generated from the reference clock signal CK_R, in the process of outputting the clock signal CK_O based on the clock signal CK_O divided with a fractional value.

FIG. 6 is a flowchart illustrating an operation in which a clock generation device generates a clock signal, according to an embodiment.

Referring to FIG. 6, the clock generation device 100 according to an embodiment outputs the clock signal CK_O, which has the second period T2 distinguished from the first period T1, by using the reference clock signal CK_R having the first period T1.

The clock generation device 100 of FIG. 6 may be understood as an example of operating the clock generation device 100 of FIG. 1.

The clock generation device 100 may output the clock signal CK_O together with spur components below a threshold value, based on a signal including pulses modulated by as much as a multiple of the second period T2 from the first period T1 of the reference clock signal CK_R.

In operation S10, the clock generation device 100 receives the reference clock signal CK_R. For example, the clock generation device 100 may receive the reference clock signal CK_R having the first period T1.

27 or example, the reference clock signal CK_R may be generated by a crystal oscillator, but the present disclosure is not limited thereto.

In operation S20, the clock generation device 100 generates the modulated clock signal MOD, based on the reference clock signal CK_R.

In detail, the clock generation device 100 may modulate at least one pulse of the reference clock signal CK_R having the first period T1 by as much as a multiple of the second period T2 so as to be output as the modulated clock signal MOD.

The clock generation device 100 may modulate at least one pulse of the reference clock signal CK_R having the first period T1 by as much as a multiplication value of the first component times the second period T2 so as to be output as the modulated clock signal MOD.

For example, the clock generation device 100 may generate the first pulse P1 based on the reference clock signal CK_R and may generate the second pulse P2 after a time corresponding to a value obtained by adding the first period T1 and the second period T2.

Also, the delay line 121 may generate the second pulse P2 and may generate the third pulse P3 after a time corresponding to a value obtained by subtracting the second period T2 from the first period T1.

In another example, the clock generation device 100 may generate the first pulse P1 based on the reference clock signal CK_R and may generate the second pulse P2 after a time obtained by adding the first period T1 and two times the second period T2.

That is, the modulated clock signal MOD may include a plurality pulses which are generated by modulating the pulses of the reference clock signal CK_R by as much as a value obtained by multiplying the second period and the first component together.

Herein, the first component may be understood as an integer value determined depending on the certain probability based on the PRBS pattern, but the present disclosure is not limited thereto.

In operation S30, the clock generation device 100 generates the pulse signal PUL in response to rising edges of the modulated clock signal MOD.

In detail, the clock generation device 100 may generate a pulse with a specified width in response to the rising edge of each of a plurality of pulses included in the modulated clock signal MOD.

The clock generation device 100 may output pulses, where each of the pules has a specified width and is generated in response to the rising edge of each of the plurality of pulses of the modulated clock signal MOD, and each of the plurality of pulses of the modulated clock signal MOD may be generated at a point in time modulated by as much as a multiple of the second period.

For example, after the first pulse P1 of the modulated clock signal MOD is generated, the clock generation device 100 may generate a pulse with a specified width in response to the second pulse P2 generated after a time corresponding to a value obtained by adding a multiplication value of the first component times the second period T2 to the first period T1.

In another example, after the first pulse P1 of the modulated clock signal MOD is generated, the clock generation device 100 may generate a pulse having a specified width in response to the second pulse P2 generated after a time corresponding to a value obtained by subtracting a multiplication value of the first component times the second period T2 from the first period T1.

In operation S40, the clock generation device 100 generates the clock signal CK_O, based on the reference clock signal CK_R and the pulse signal PUL.

In detail, the clock generation device 100 may output the clock signal CK_O based on the reference clock signal CK_R, and a ratio of the period (or frequency) of the clock signal CK_O to the period (or frequency) of the reference clock signal CK_R may be set in advance.

For example, the clock generation device 100 may output the clock signal CK_O, which has the second period T2 corresponding to ⅓ of the first period T1, based on the reference clock signal CK_R having the first period T1.

Herein, the clock signal CK_O which is generated to have the second period T2 may include the jitter component JT that is accumulated on each pulse generated depending on the second period T2.

In detail, since pulses are continuously generated through the oscillator 113, the clock signal CK_O may include the jitter component JT accumulated on each pulse.

According to an embodiment, the clock generation device 100 outputs the clock signal CK_O which has the second period T2 and is synchronized with the reference clock signal CK_R at a point in time when the pulse of the pulse signal PUL is input.

Herein, since the clock signal CK_O is synchronized with the reference clock signal CK_R based on the pulse signal PUL, the jitter component JT accumulated on the clock signal CK_O while the clock signal CK_O is generated may be removed.

Accordingly, the clock generation device 100 according to an embodiment of the present disclosure may increase the quality of the clock signal CK_O generated from the reference clock signal CK_R.

Also, as the pulses included in the pulse signal PUL are input, the clock generation device 100 may output spurious components together with the clock signal CK_O.

In detail, the clock generation device 100 may output the spur component according to the input timing of each pulse in response to input of each of the plurality of pulses included in the pulse signal PUL.

For example, when the generation of one pulse of the pulse signal PUL is advanced with respect to the first period by as much as the second period, a spur component due to the one pulse may be generated at a frequency corresponding to a value obtained by adding the second frequency $1/T2$ corresponding to the second period T2 and the first frequency $1/T1$ corresponding to the first period T1.

That is, the spur components due to the pulse signal PUL may be generated at frequencies modulated by the pulses of the pulse signal PUL, each of which is generated at a point in time modulated by as much as a multiple of the second period T2, by as much as a multiple of the second frequency $1/T2$ corresponding to the second period T2.

Herein, the multiple of the second frequency $1/T2$ corresponding to the second period T2 may be understood as a value obtained by multiplying the reciprocal of the second period T2 by the first component (or an integer value) determined with the certain probability depending on the PRBS pattern.

Accordingly, the spur components due to the pulse signal PUL may be distributed and generated at frequencies, each of which is modulated by as much as a multiple of the second period T2 from the first frequency $1/T1$.

For example, the spur components which are generated together with the clock signal CK_O may be distributed and generated at frequencies, each of which is modulated by as much as one time or two times the second frequency $1/T2$ corresponding to the second period T2 from the first frequency $1/T1$ corresponding to the first period T1.

In this case, for example, the spur components due to the pulse signal PUL may be distributed and generated at frequencies of $(1/T1+1/T2)$, $(1/T1+2/T2)$, $(1/T1-1/T2)$, $(1/T1-2/T2)$, and $1/T1$.

In this case, the spur components may have a relatively low peak value (or maximum value) compared to the case where the spur components are generated by pulse signals generated depending on the first period T1 only at the first frequency 1/T1 corresponding to the first period T1.

Accordingly, the clock generation device 100 may distribute the spur components due to the pulses of the pulse signal PUL into a plurality of frequencies each corresponding to a multiple of the second frequency 1/T2 corresponding to the second period T2.

Accordingly, the clock generation device 100 according to an embodiment of the present disclosure may prevent the quality of the clock signal CK_O from being degraded due to the spur components. That is, the clock generation device 100 may increase the quality of the clock signal CK_O generated from the reference clock signal CK_R.

FIG. 7 is a flowchart illustrating an operation in which a clock generation device generates a clock signal based on a phase difference between a reference clock signal and a divided clock signal, according to an embodiment.

Referring to FIG. 7, the clock generation device 100 according to an embodiment may output the clock signal CK_O, based on a phase difference between the reference clock signal CK_R and the divided clock signal CK_O.

The clock generation device 100 of FIG. 7 may be understood as an example of operating the clock generation device 100 of FIG. 1.

In detail, the clock generation device 100 may output the clock signal CK_O such that the reference clock signal CK_R and the divided clock signal CK_O have a preset phase difference.

In operation S41, the clock generation device 100 detects the phase difference between the reference clock signal CK_R and the divided clock signal CK_O.

In detail, the clock generation device 100 may detect the phase difference between the reference clock signal CK_R and the clock signal CK_O divided depending on a preset dividing ratio, by using the phase detector 111.

In operation S42, the clock generation device 100 generates a control signal which allows the oscillator 113 to output the clock signal CK_O.

In detail, based on the phase difference between the reference clock signal CK_R and the divided clock signal CK_O, the clock generation device 100 may generate the control signal such that the oscillator 113 outputs the clock signal CK_O having a preset phase difference with the reference clock signal CK_R.

For example, by using the loop filter 112, the clock generation device 100 may generate the control signal such that the oscillator 113 outputs the clock signal CK_O having a preset phase difference with the reference clock signal CK_R.

In operation S43, the clock generation device 100 generates the clock signal CK_O, based on the control signal and the pulse signal PUL.

In detail, the clock generation device 100 may output the clock signal CK_O having the second period T2, based on the control signal received from the loop filter 112.

Herein, the clock signal CK_O which is generated to have the second period T2 may include the jitter component JT which is accumulated on each pulse generated depending on the second period T2. In detail, as the pulses are continuously generated through the oscillator 113, the clock signal CK_O may include the jitter component JT accumulated on each pulse.

According to an embodiment, the clock generation device 100 may output the clock signal CK_O which includes pulses synchronized with the reference clock signal CK_R at points in time when the pulses of the pulse signal PUL are respectively input.

Since the clock signal CK_O is synchronized with the reference clock signal CK_R based on the pulse signal PUL, the jitter component JT accumulated on the clock signal CK_O while the clock signal CK_O is generated may be removed.

Accordingly, the clock generation device 100 according to an embodiment of the present disclosure may increase the quality of the clock signal CK_O generated from the reference clock signal CK_R.

Also, at least some of the pulses of the pulse signal PUL may be input at points in time each modulated by as much as a multiple of the second period T2 from the first period T1.

Accordingly, the clock generation device 100 may output the spur components which are distributed and generated at frequencies, each of which is modulated by as much as a multiple of the second frequency 1/T2 corresponding to the second period T2, depending on the pulse signal PUL.

For example, the spur components which are generated together with the clock signal CK_O may be distributed and generated at frequencies, each of which is modulated by as much as one time or two times the second frequency 1/T2 corresponding to the second period T2 from the first frequency 1/T1 corresponding to the first period T1.

In this case, the spur components may have a relatively low peak value (or maximum value) compared to the case where the spur components are generated by pulse signals generated depending on the first period T1 only at the first frequency 1/T1 corresponding to the first period T1.

Accordingly, the clock generation device 100 according to an embodiment of the present disclosure may prevent the quality of the clock signal CK_O from being degraded due to the spur components. That is, the clock generation device 100 may increase the quality of the clock signal CK_O generated from the reference clock signal CK_R.

FIG. 8 is a flowchart illustrating an operation in which a clock generation device generates a modulated clock signal by modulating a reference clock signal based on a first component determined based on a PRBS pattern, according to an embodiment.

Referring to FIG. 8, the clock generation device 100 according to an embodiment may modulate the reference clock signal CK_R by using the first component determined based on the PRBS pattern.

The clock generation device 100 of FIG. 8 may be understood as an example of operating the clock generation device 100 of FIG. 1.

In operation S21, the clock generation device 100 determines the first component based on the PRBS pattern.

In detail, the clock generation device 100 may determine the first component from a plurality of components depending on the certain probability, based on the PRBS pattern which is implemented such that each of the plurality of components is output with the same probability.

Herein, the first component may be understood as an integer value determined depending on the certain probability from among a plurality of integers, but the present disclosure is not limited thereto.

Also, herein, the PRBS pattern may be understood as a random pattern which is implemented such that each of the plurality of components is output with the same probability. For example, the PRBS pattern may be understood as a random pattern which is implemented to correspond to an integer among the plurality of components.

In operation S22, the clock generation device 100 generates the modulated clock signal MOD including pulses modulated based on the first component.

In detail, the clock generation device 100 may output the modulated clock signal MOD by modulating at least some pulses included in the reference clock signal CK_R by as much as a value obtained by multiplying the second period T2 of the clock signal CK_O and the first component together.

Also, the clock generation device 100 may generate the pulse signal PUL in response to the modulated clock signal MOD. In detail, the clock generation device 100 may generate pulses with a specified width in response to the rising edges of the pulses included in the modulated clock signal MOD.

In addition, the clock generation device 100 may output the spur components which are distributed into frequencies, each of which is modulated by as much as a multiple of the second frequency 1/T2 corresponding to the second period T2, depending on the pulse signal PUL generated in response to the modulated clock signal MOD.

In this case, the spur components may have a relatively low peak value (or maximum value) compared to the case where the spur components are generated by pulse signals generated depending on the first period T1 only at the first frequency 1/T1 corresponding to the first period T1.

Accordingly, the clock generation device 100 according to an embodiment of the present disclosure may prevent the quality of the clock signal CK_O from being degraded due to the spur components. That is, the clock generation device 100 may increase the quality of the clock signal CK_O generated from the reference clock signal CK_R.

As described above, the clock generation device 100 according to an embodiment of the present disclosure may generate the spur components sp due to the pulses of the pulse signal PUL so as to be distributed into a plurality of frequencies each modulated by as much as a multiple of the second frequency 1/T2 from the first frequency 1/T1, and thus, the spur components sp below the threshold value Pth may be generated.

Accordingly, the clock generation device 100 according to the present disclosure may prevent the quality of the clock signal CK_O from being degraded due to the spur components.

Also, the clock generation device 100 according to an embodiment of the present disclosure may increase the quality of the clock signal CK_O generated from the reference clock signal CK_R.

In addition, the clock generation device 100 according to an embodiment of the present disclosure may increase the quality of the clock signal CK_O generated from the reference clock signal CK_R, in the process of outputting the clock signal CK_O based on the clock signal CK_O divided by a fractional value.

A clock generation device according to an embodiment of the present disclosure may increase the quality of a clock signal generated from a reference clock signal.

Please note that while certain embodiments above make use of a rising edge, the disclosure is not limited thereto since a falling edge may be used in other embodiments.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A clock generation device comprising:
a delay line configured to generate a modulated clock signal from a reference clock signal having a first period;
a pulse generator configured to receive the modulated clock signal and to generate a pulse signal in response to edges of pulses included in the modulated clock signal; and
a clock generator configured to generate a clock signal having a second period distinguished from the first period, based on the reference clock signal and the pulse signal,
wherein the delay line generates a first pulse, and subsequently a second pulse, based on the reference clock signal,
wherein a time difference between generation of the first pulse and the second pulse is based on a value obtained by multiplying the second period by a first numerical value, and
wherein the first numerical value is selected from a plurality of numeral values according to a certain probability.

2. The clock generation device of claim 1, wherein the clock generator comprises:
a phase detector configured to detect a phase difference between the reference clock signal and a divided clock signal obtained by dividing the clock signal;
a loop filter configured to generate a control signal, based on the phase difference; and
an oscillator configured to output the clock signal having the second period based on the control signal and the pulse signal.

3. The clock generation device of claim 2, further comprising:
a divider configured to divide the clock signal; and
a delta sigma modulator connected to the divider,
wherein the divider divides the clock signal with a fractional value, based on dividing ratio information generated by the delta sigma modulator,
wherein the phase detector determines a phase difference between the divided clock signal divided with the fractional value and the reference clock signal, and
wherein the dividing ratio information includes a ratio of a frequency of the reference clock signal and a frequency of the clock signal.

4. The clock generation device of claim 1, wherein the clock generator generates the clock signal including pulses each synchronized with the reference clock signal at a point in time when a pulse included in the pulse signal is received.

5. The clock generation device of claim 1, wherein the delay line comprises a selector configured to select the first numerical value, and
wherein the selector selects the first numerical value determined according to the certain probability based on a pseudo random binary sequence (PRBS) pattern allowing each of the plurality of numerical values to be selected with the certain probability.

6. The clock generation device of claim 5, wherein the delay line further comprises:
a plurality of modulation circuits each outputting a signal modulated by the second period from an input signal, and
wherein the delay line outputs the modulated clock signal output through a number of the modulation circuits which corresponds to the first numerical value, from among the plurality of modulation circuits, based on a selection signal that corresponds to the first numerical value.

7. The clock generation device of claim 6, wherein the delay line further comprises a reference circuit, wherein the reference circuit receives the clock signal and outputs a modulation signal allowing a signal modulated by the second period from the clock signal to be output, and wherein each of the plurality of modulation circuits delays an input signal by the second period, based on the modulation signal.

8. The clock generation device of claim 7, wherein the reference circuit outputs the modulation signal, which allows each of the plurality of modulation circuits to modulate an input signal by the second period, based on a phase difference between the signal modulated by the second period from the clock signal and the clock signal.

9. The clock generation device of claim 5, wherein the delay line generates a third pulse after a time, which is obtained by modulating the first period by a multiplication value of the second period and a second numerical value distinguished from the first numerical value, from a point in time when the second pulse is generated, and wherein the second numerical value is determined depending on the certain probability based on the PRBS pattern.

10. The clock generation device of claim 9, wherein the first pulse, the second pulse, and the third pulse cause spurious components below a preset threshold value at different frequencies, respectively, together with the clock signal.

11. A clock generation method comprising:

receiving a reference clock signal having a first period;

generating a modulated clock signal based on the reference clock signal;

generating a pulse signal in response to edges of a plurality of pulses included in the modulated clock signal; and generating a clock signal having a second period distinguished from the first period, based on the pulse signal and the reference clock signal, wherein the generating of the modulated clock signal comprises:

generating a first pulse based on the reference clock signal; and after generating the first pulse, generating a second pulse after a time based on a value obtained by multiplying the second period by a first numerical value, and wherein the first numerical value is selected from a plurality of numerical values according to a certain probability.

12. The clock generation method of claim 11, wherein the generating of the clock signal based on the pulse signal and the reference clock signal comprises:

determining, by a phase detector, a phase difference between the reference clock signal and a divided clock signal obtained by dividing the clock signal;

generating a control signal based on the determined phase difference; and outputting, by an oscillator, the clock signal having the second period based on the control signal and the pulse signal.

13. The clock generation method of claim 11, wherein the clock signal includes pulses synchronized with the reference clock signal at points in time when the first pulse and the second pulse are respectively generated.

14. The clock generation method of claim 11, further comprising:

outputting a selection signal based on the first numerical value, based on a pseudo random binary sequence (PRBS) pattern allowing each of the numerical values to be selected with the certain probability.

15. The clock generation method of claim 11, wherein at least two or more pulses of the pulse signal cause spurious components below a preset threshold value at different frequencies, respectively, together with the clock signal.

16. A clock generation device comprising:

a delay line configured to generate a modulated clock signal from a reference clock signal having a first period;

a pulse generator connected to the delay line, and configured to generate a pulse signal in response to edges of a plurality of pulses included in the modulated clock signal;

a phase detector configured to detect a phase difference between the reference clock signal and a divided clock signal;

a loop filter configured to generate a control signal, based on the phase difference from the phase detector; and an oscillator configured to output a clock signal having a second period based on the control signal and the pulse signal, wherein the delay line generates a first pulse based on the reference clock signal, and a second pulse following the first pulse by a time based on a value obtained by multiplying the second period by a first numerical value, and wherein the first numerical value is selected from a plurality of numerical values according to a certain probability.

17. The clock generation device of claim 16, wherein the first numerical value is selected based on a pseudo random binary sequence (PRBS) pattern allowing each of the plurality of numerical value to be selected with the certain probability.

18. The clock generation device of claim 17, wherein the delay line generates a third pulse after a time, which is obtained by modulating the first period by a multiplication value of the second period and a second numerical value distinguished from the first numerical value, from a point in time when the second pulse is generated, and wherein the second numerical value is determined from the plurality of numerical values depending on the certain probability, based on the PRBS pattern.

19. The clock generation device of claim 18, wherein the first pulse, the second pulse and the third pulse cause spurious components below a preset threshold value at different frequencies, respectively, together with the clock signal.

20. The clock generation device of claim 16, wherein the oscillator outputs the clock signal including pulses each synchronized with the reference clock signal at a point in time when the pulse signal is received.

* * * * *